(12) United States Patent
Albano et al.

(10) Patent No.: US 7,532,060 B2
(45) Date of Patent: May 12, 2009

(54) CHARGE-PUMP DEVICE WITH INCREASED CURRENT OUTPUT

(76) Inventors: Carmela Albano, Via G. De Felice, 20, Sant'Agata Li Battiati (IT); Daniele Vimercati, Via Martin Luther King, 10, 20048 Carate Brianza (IT)

( * ) Notice: Subject to any disclaimer, the term of this patent is extended or adjusted under 35 U.S.C. 154(b) by 0 days.

(21) Appl. No.: 11/270,308

(22) Filed: Nov. 9, 2005

(65) Prior Publication Data

US 2006/0120157 A1    Jun. 8, 2006

(30) Foreign Application Priority Data

Nov. 11, 2004    (IT)    .......................... TO2004A0791

(51) Int. Cl.
    *G05F 1/10*    (2006.01)
(52) U.S. Cl. ............................. 327/536; 363/59; 363/60
(58) Field of Classification Search ................. 327/536; 363/59, 60

See application file for complete search history.

(56) References Cited

U.S. PATENT DOCUMENTS

| | | | |
|---|---|---|---|
| 4,970,409 A * | 11/1990 | Wada et al. ................... | 327/541 |
| 5,043,858 A * | 8/1991 | Watanabe ..................... | 363/61 |
| 6,157,242 A * | 12/2000 | Fukui .......................... | 327/536 |
| 6,160,723 A * | 12/2000 | Liu ............................. | 363/60 |
| 6,359,947 B1 * | 3/2002 | Rao ............................ | 375/374 |
| 6,480,057 B2 * | 11/2002 | Ogura ......................... | 327/536 |
| 6,545,529 B2 * | 4/2003 | Kim ............................ | 327/536 |
| 6,781,440 B2 * | 8/2004 | Huang ......................... | 327/537 |
| 6,952,129 B2 * | 10/2005 | Lin et al. ..................... | 327/536 |
| 7,102,422 B1 * | 9/2006 | Sawada et al. .............. | 327/536 |
| 7,116,154 B2 * | 10/2006 | Guo ............................ | 327/536 |

\* cited by examiner

*Primary Examiner*—Kenneth B. Wells
(74) *Attorney, Agent, or Firm*—Schwabe Williamson & Wyatt

(57) ABSTRACT

In a charge-pump device, a charge-pump circuit has an input, which is connected to a supply line and receives a supply voltage, and an output; in the charge-pump circuit a first elementary stage defines a first transfer node and a second transfer node that can be connected respectively to the input and to the output, and has at least one first phase input. In addition, in the first elementary stage a first switching element is arranged between the first transfer node and the second transfer node, has a control terminal receiving a control signal, and is closed during a charge-transfer interval; and first charge-storage means are connected between the control terminal and the first phase input. In the first elementary stage, a voltage-booster stage has an input connected to the first phase input of the first elementary stage, and an output connected to the first charge-storage means and supplies a boosted phase signal; in particular, the voltage-booster stage is operative during the charge-transfer interval.

24 Claims, 5 Drawing Sheets

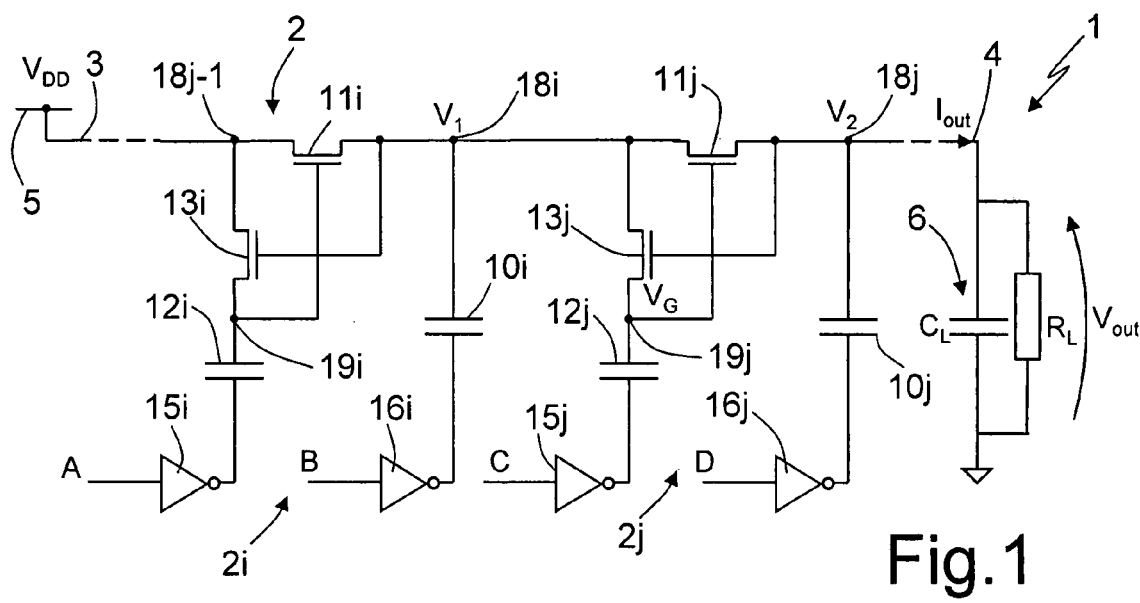
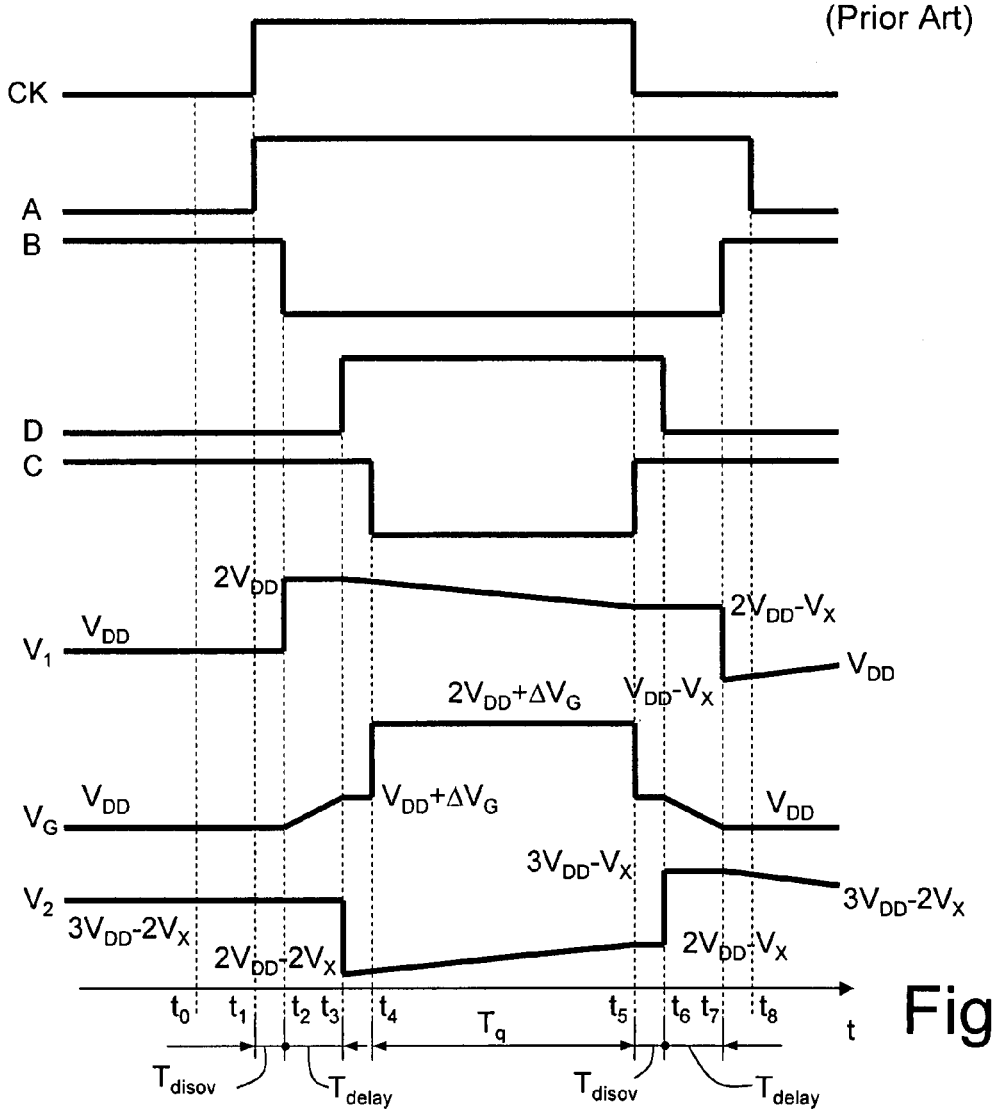
Fig.1 (Prior Art)
Fig.2

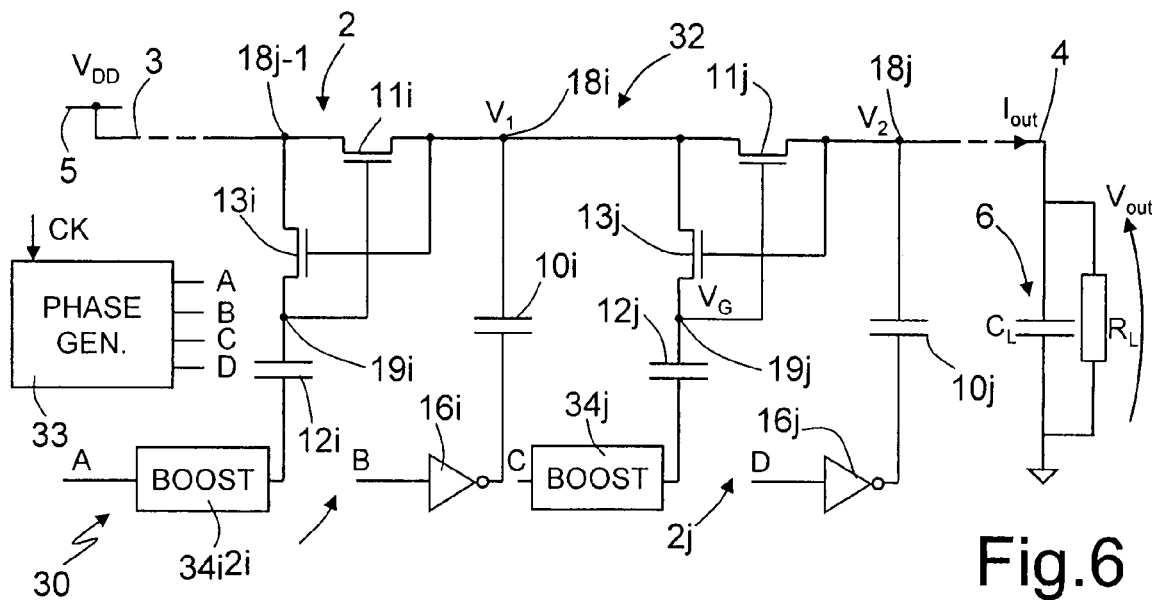
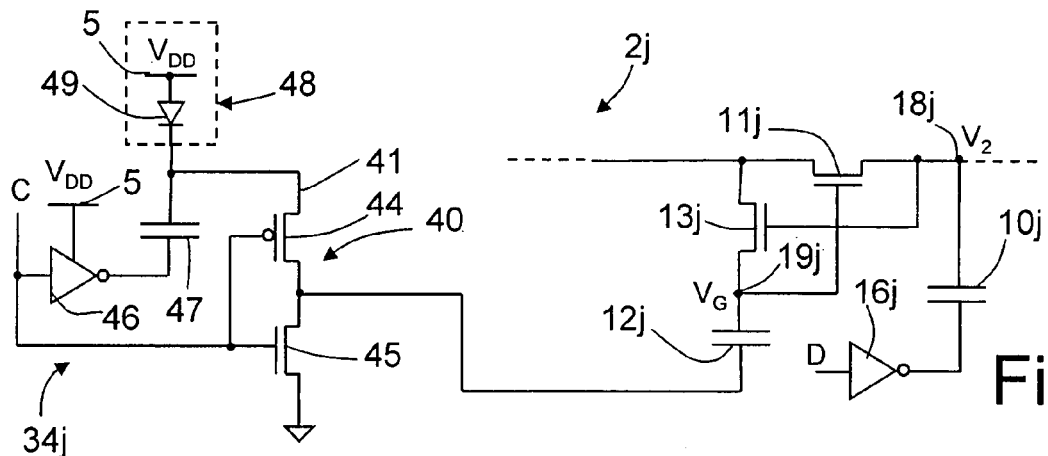
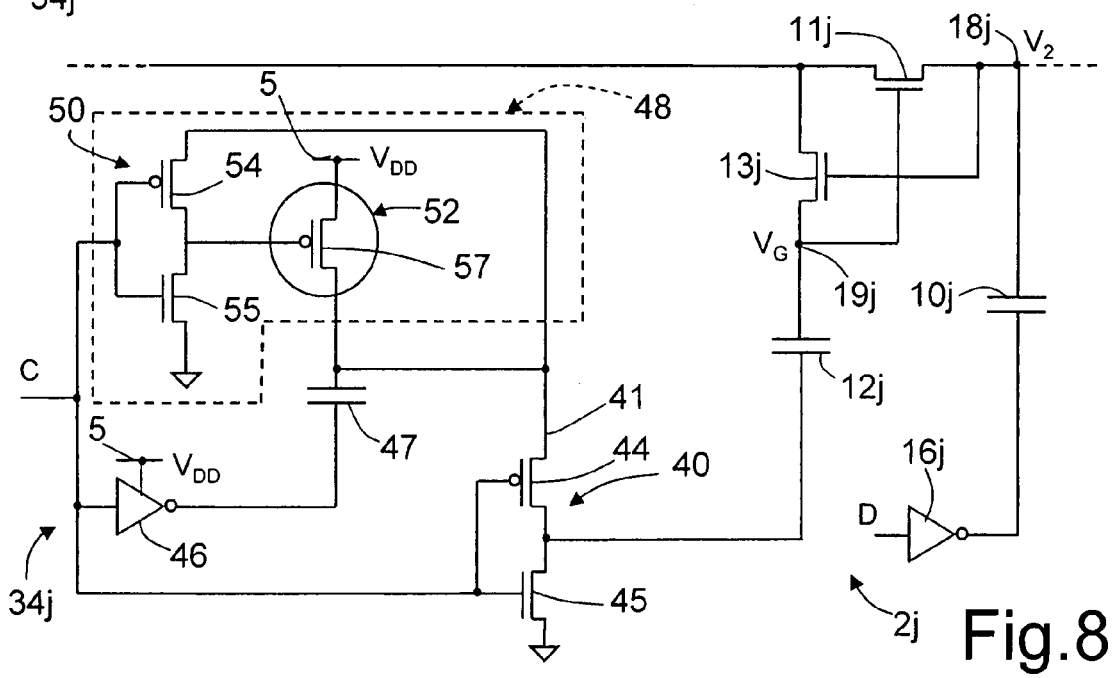
Fig.6
Fig.7
Fig.8

CHARGE-PUMP DEVICE WITH INCREASED CURRENT OUTPUT

BACKGROUND OF THE INVENTION

1. Field of the Invention

The present invention relates to a charge-pump device with increased current output, in particular for use in a memory device, to which the following description will make explicit reference without however this implying any loss in generality.

2. Discussion of the Related Art

As is known, memory devices comprise voltage-booster devices which use charge-pump circuits. These charge-pump circuits generate boosted voltages (i.e. of a value higher than the supply voltage), which are necessary for performing read and modify (erasure or programming) operations on the memory devices. The charge-pump circuits must moreover supply at their output the levels of current necessary for performing the aforesaid read and modify operations.

It is moreover known that charge-pump circuits have significant problems of power consumption and of area occupation, above all when the memory devices in which they are incorporated are used in applications that require low levels of power consumption and small overall dimensions, such as, for example, portable applications (digital cameras, Mp3 readers, cellphones, smart cards, etc.).

Furthermore, the increase in parallelism and the reduction in the programming times in current memory devices make it necessary to supply an increasingly higher current by the charge-pump circuits. Said levels of current are difficult to obtain with existing charge-pump circuits without allocating a large area on silicon, as explained hereinafter with reference to FIGS. 1-4.

In particular, FIG. 1 shows a charge-pump circuit 1 of a known type, formed by a plurality of elementary stages 2 (only two of which are shown in FIG. 1). The elementary stages 2 are connected in a cascaded fashion between an input 3 and an output 4 of the charge-pump circuit 1. The input 3 is connected to a low-voltage supply line 5, set at a supply voltage $V_{DD}$, for example of 1.6 V, whilst the output 4 supplies an output voltage $V_{out}$, generally higher than the supply voltage $V_{DD}$, to a load 6. The load 6 is made up, for example, of the column capacitance $C_L$ of a memory array (not shown) of the memory device incorporating the charge-pump circuit 1, and of a resistor $R_L$, connected in parallel to the column capacitance $C_L$, and representing the power consumption due to memory internal operations.

Each elementary stage 2 receives at input two of four phase signals A, B, C and D provided by a phase-generator stage (not shown). In particular, the elementary stages 2 set in an odd position in the cascade (which are designated in FIG. 1 by the reference 2i and are referred to in what follows as "odd elementary stages" 2i) receive the phase signals A and B, whilst the elementary stages 2 set in an even position in the cascade (which are designated in FIG. 1 by the reference 2j and are referred to in what follows as "even elementary stages" 2j) receive the phase signals C and D. The phase signals A, B, C, D are logic signals that can assume a low value (equal to 0 V) or a high value (equal to $V_{DD}$).

For convenience of description, only one of the elementary stages 2 is described, namely, an odd elementary stage 2i; the even elementary stage 2j has, in fact, identical components, which are designated by the same reference numbers followed by the identifier j.

In detail, each odd elementary stage 2i comprises: a pumping capacitor 10i; a charge-transfer transistor 11i; a boost capacitor 12i; a pre-charge transistor 13i; and a first buffer and a second buffer, represented schematically in FIG. 1 and referred in what follows as first inverter 15i and second inverter 16i, of a logic type.

The pumping capacitor 10i has a first terminal connected to a charge-transfer node 18i of the odd elementary stage 2i, and a second terminal connected to the output of the second inverter 16i, which in turn receives at its input the phase signal B. The charge-transfer transistor 11i has its drain terminal connected to the charge-transfer node 18i, its source terminal connected to a charge-transfer node 18j-1 of an even elementary stage 2j-1 that precedes the odd elementary stage 2i (or else to the input 3, if the odd elementary stage 2i is the first stage of the cascade), and its gate terminal connected to a pre-charge node 19i. The boost capacitor 12i has a first terminal connected to the pre-charge node 19i and a second terminal connected to the output of the first inverter 15i, which in turn receives at input the phase signal A. The pre-charge transistor 13i has its source terminal connected to the charge-transfer node 18j-1 of the preceding even elementary stage 2j-1, its drain terminal connected to the pre-charge node 19i, and its gate terminal connected to the charge-transfer node 18i.

The even elementary stage 2j, as indicated, has the same circuit structure, and differs from the odd elementary stage 2i only in that the first inverter 15j receives at input the phase signal C, and the second inverter 16j receives at input the phase signal D.

Operation of the charge-pump circuit 1 is now described with reference to FIG. 2 as regards the first two stages of the cascade, the first odd elementary stage 2i and the first even elementary stage 2j. In particular, FIG. 2 shows: a clock signal CK; the phase signals A, B, C, D generated by the phase-generator stage; the voltage, designated by $V_1$ (see also FIG. 1), at the charge-transfer node 18i; the voltage, designated by $V_G$ (see also FIG. 1), at the pre-charge node 19j (coinciding with the voltage on the gate terminal of the charge-transfer transistor 11j); and the voltage, designated by $V_2$, at the charge-transfer node 18j (see also FIG. 1). A steady-state operating condition is further assumed; namely, it is assumed that the transients are complete and that the pumping capacitors 10i, 10j charge and discharge at each cycle of the clock signal CK by an amount of charge $\Delta Q$ proportional to the increase/decrease in the voltage across their terminals, designated by $V_x$.

At instant $t_0$, the phase signals A and D have a low value, and the phase signals B and C have a high value. Consequently, the charge-transfer transistor 11i is on and the voltage $V_1$ is equal to $V_{DD}$; and the charge-transfer transistor 11j is off and the voltage $V_2$ is equal to $3V_{DD}-2V_x$. In addition, the pre-charge transistor 13j is on and the voltage $V_G$ is equal to $V_{DD}$.

At instant $t_1$ (ideally corresponding to the rising edge of the clock signal CK), the phase signal A switches to the high value, turning off the charge-transfer transistor 11i. Then, after a first time interval $T_{disov}$, which is necessary for preventing return of charge towards the supply line 5, at instant $t_2$, the phase signal B switches to the low value, boosting the voltage $V_1$ to a value equal to $2V_{DD}$. At the same instant, the voltage $V_G$ starts increasing, in so far as the pre-charge transistor 13j is still on, and the boost capacitor 12j charges to the new value assumed by the voltage $V_1$.

At instant $t_3$, after a second time interval $T_{delay}$, necessary for increasing the voltage $V_G$ by a value $\Delta V_G$ (for example, equal to 0.5 V), the phase signal D switches to the high value, and the voltage $V_2$ decreases to the value $2V_{DD}-2V_x$. Consequently, the pre-charge transistor 13*j* turns off, and the voltage $V_G$ stops increasing.

After a time interval (equal to the first time interval $T_{disov}$, given the symmetry of generation by the phase generator of the phase signals A and C starting respectively from the phase signals B and D), at instant $t_4$ the phase signal C switches to the low value, the signal $V_G$ rises to the value $2V_{DD}+\Delta V_G$, thus switching the charge-transfer transistor 11*j* on.

From instant $t_4$ a charge-transfer interval $T_q$ begins, in which the amount of charge $\Delta Q$ is transferred from the pumping capacitor 10*i* of the odd elementary stage 2*i* to the pumping capacitor 10*j* of the even elementary stage 2*j*, in such a way as to raise the voltage $V_2$ by the value $V_x$. At the end of the charge-transfer interval $T_q$, at instant $t_5$ (ideally corresponding to the falling edge of the clock signal CK), the voltage $V_1$ has fallen to the value $2V_{DD}-V_x$, and the voltage $V_2$ has risen accordingly to the value $2V_{DD}-V_x$. Furthermore, at instant $t_5$, the phase signal C switches again to the high value, and the voltage $V_G$ decreases to the value $V_{DD}+\Delta V_G$ turning off the charge-transfer transistor 11*j* and consequently interrupting charge transfer.

Once the first time interval $T_{disov}$ has elapsed again, starting from the switching of the phase signal C, at instant $t_6$, the phase signal D switches to the low value, boosting the voltage $V_2$ to the value $3V_{DD}-V_x$. Next, at instant $t_7$, once the second time interval $T_{delay}$ has elapsed again, the phase signal B switches to the high state, and the voltage $V_1$ decreases to the value $V_{DD}-V_x$. After a time interval (equal to the first time interval $T_{disov}$ on account of the aforementioned symmetry of generation of the phase signals), at instant $t_8$, the phase signal A switches to the low state, turning on the charge-transfer transistor 11*i* and giving rise to a new charge transfer from the supply line 5 to the pumping capacitor 10*i*.

If the charge-pump circuit 1 comprises more elementary stages 2, the described steps of charge transfer occur in a synchronous way in all the odd elementary stages 2*i* in a first half-period of the clock signal CK, and subsequently in all the even elementary stages 2*j* in the second half-period of the clock signal CK. In this way, a gradual charge transfer from the input 3 to the output 4 of the charge-pump circuit 1 is obtained.

In particular, the current $I_{out}$ (FIG. 1) supplied to the load 6 by the charge-pump circuit 1 is given by:

$$I_{out}=f_{ck} \cdot C_s \cdot [(n+1) \cdot V_{DD}-V_{out}]$$

where n is the number of cascaded stages, $f_{ck}$ is the frequency of the clock signal CK, and $C_s$ is the capacitance of the pumping capacitor 10*i*, 10*j*.

The charge-pump circuit 1 suffers from a major limitation as regards the maximum current $I_{out}$ that can be supplied to the load.

In fact, as highlighted by the above formula, given the same voltages $V_{DD}$ and $V_{out}$ and number of stages n, in order to increase the current $I_{out}$ it is necessary to increase the capacitance $C_s$ or else the frequency $f_{ck}$. However, increasing each of the aforesaid quantities entails specific disadvantages inherent in the requirements of power consumption and of area occupation.

In detail, an increase in the capacitance $C_s$ entails a corresponding increase in the area occupied by the charge-pump circuit 1, an increase which, as indicated above, is inadmissible in many applications. For example, in order to reach the desired value of current $I_{out}$ of approximately 7 mA, the charge-pump circuit 1 would have to occupy an area approximately four times greater as compared to the case where the current $I_{out}$ itself were to have a value of 1.7 mA. Said increase further entails an increase in the production costs of the charge-pump circuit 1.

Furthermore, as highlighted in FIG. 3, the current $I_{out}$ increases as the frequency $f_{ck}$ increases, until the frequency $f_{ck}$ reaches a value designated by $f_{max}$ (depending upon the architecture of the individual elementary stage); instead, for values of frequency $f_{ck}$ higher than $f_{max}$, the current $I_{out}$ supplied decreases (so that the current $I_{out}$ has a maximum designated by $I_{outmax}$). Consequently, with the circuit described above, the increase in the frequency $f_{ck}$ does not enable the desired increase in the current $I_{out}$ to be obtained.

In fact, only a portion of each half-period of the clock signal CK is effectively dedicated to the charge transfer from one elementary stage 2 to the next. There exists a time interval, referred to in what follows as dead time $T_m$, which elapses between switching of the clock signal CK and switching of the phase signal C to the low value, at which the charge-transfer interval $T_q$ starts. The duration of said dead time $T_m$ is given by:

$$T_m = T_{delay} + 2 \cdot T_{disov}$$

and the charge-transfer interval $T_q$ can thus be expressed as:

$$T_q = \frac{T_{ck}}{2} - T_m$$

where $T_{ck}$ is the period of the clock signal CK.

As the frequency $f_{ck}$ increases, and so as the period $T_{ck}$ decreases, the dead time $T_m$ being constant, the charge-transfer interval $T_q$ progressively decreases. Consequently, when a maximum value of the frequency $f_{ck}$ (coinciding with the maximum frequency $f_{max}$ of FIG. 3) is exceeded, the amount of charge $\Delta Q$ is no longer transferred in a complete way, and the boost capacitor 10*i*, 10*j* is no longer sufficiently charged. Deriving from this is a reduction in the current $I_{out}$ for frequencies $f_{ck}$ higher than the maximum frequency $f_{max}$.

FIG. 4 illustrates what has just been described, on the hypothesis that the current circulating in the charge-transfer transistor 11*i*, 11*j*, designated by $I_t$, has an exponential evolution during the charge-transfer interval $T_q$. In particular, the amount of charge not transferred at each half-period of the clock signal CK (hatched portion of the area under the curve of the current $I_t$) increases as the frequency $f_{ck}$ increases.

Consequently, the need is felt to provide a charge-pump circuit which will enable an increase in the current supplied to the load, and at the same time will present a reduced area occupation.

SUMMARY OF THE INVENTION

One aim of the present invention is consequently to overcome the limitations of the known art, and in particular to provide a charge-pump device that will enable increase in the current supply to the load.

According to the present invention, a charge-pump device is thus provided, comprising a charge-pump circuit having an input connected to a supply line and receiving a supply voltage, and an output; said charge-pump circuit having at least one first elementary stage defining a first transfer node and a second transfer node that can be connected respectively to said input and to said output, and having at least a first phase input; said first elementary stage further comprising: a first switching element, arranged between said first transfer node and said second transfer node and having a control terminal receiving a control signal, said first switching element being closed during a charge-transfer interval; and first charge-storage means connected between said control terminal and said first phase input; wherein said first elementary stage further comprises a voltage-booster stage having an input connected to said first phase input of said first elementary stage, and an output, which is connected to said first charge-storage means and supplies a boosted phase signal; said voltage-booster stage being configured to be operative during said charge-transfer interval.

BRIEF DESCRIPTION OF THE DRAWINGS

For a better understanding of the present invention, some preferred embodiments are now described, purely by way of non-limiting example, with reference to the attached plate of drawings, wherein:

FIG. 1 shows the circuit diagram of a charge-pump circuit of a known type;

FIGS. 2-4 show plots of electrical quantities of the circuit of FIG. 1;

FIG. 6 shows a charge-pump device according to an aspect of the present invention;

FIG. 7 shows a schematic circuit diagram of a voltage-booster stage of the device of FIG. 6;

FIG. 8 shows a detailed circuit of the voltage-booster stage of FIG. 7;

DETAILED DESCRIPTION

Figure 3:
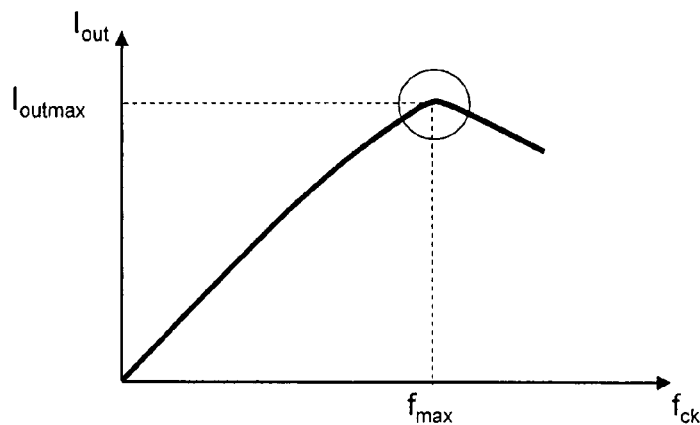
Figure 4:
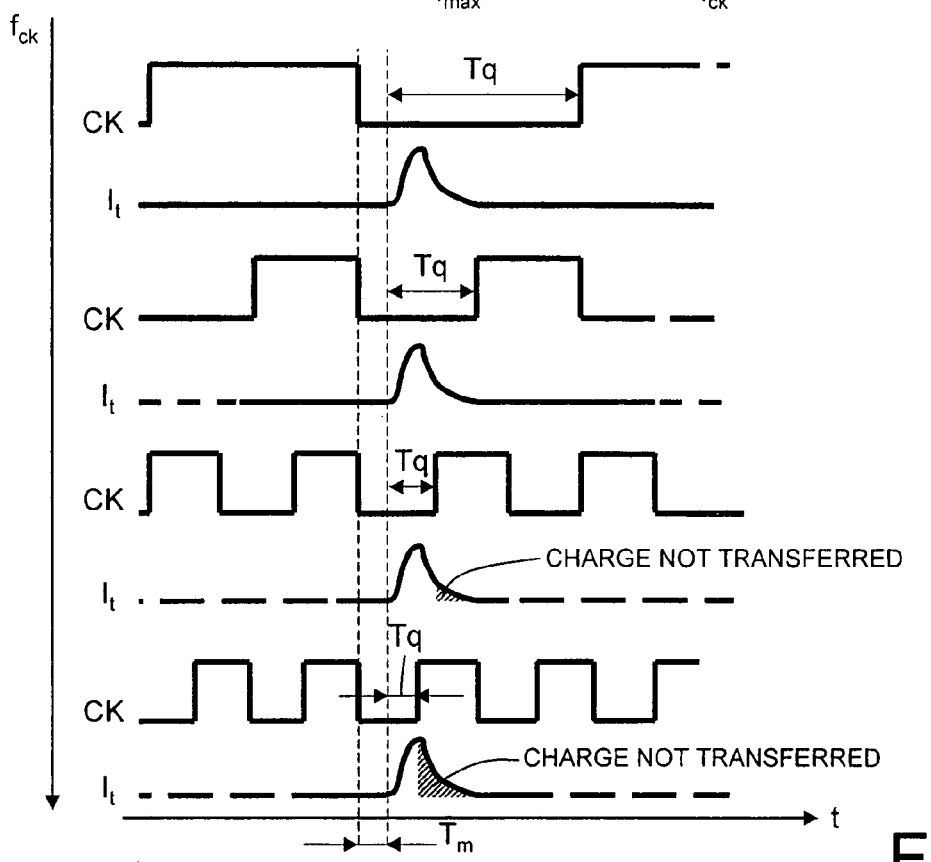

The present invention arises from the following observations. As discussed above, the dead time $T_m$ (FIG. 4) limits the charge-transfer interval $T_q$, and so the current $I_{out}$ supplied by the charge-pump circuit. Consequently, if it were possible to reduce said dead time, the time interval useful for the charge transfer could be increased, and it would thus be possible to operate at higher frequencies obtaining an increased current output. In other words, it would be possible to increase the frequency $f_{max}$ (FIG. 3), and to operate at higher frequencies of the clock signal (but always on the ascending portion of the output current/frequency curve) so as to increase the output current.

On the other hand, as indicated, it is not possible to reduce the first time interval $T_{disov}$, in so far as it is necessary to prevent return of charge towards the supply line 5 (FIG. 1). Consequently, to reduce the dead time $T_m$, the possibility of acting on the second time interval $T_{delay}$, and in particular of eliminating it, has been studied.

However, tests have highlighted that the elimination of the second time interval $T_{delay}$ entails a considerable reduction in the current supplied by the charge-pump circuit for all the values of frequency $f_{ck}$, above all in particular operating conditions. In fact, said tests have highlighted that, in the absence of the second time interval $T_{delay}$, the charge-transfer transistor 11i, 11j is not conducting sufficiently during the charge-transfer interval $T_q$. This applies above all in the presence of low temperatures, given that the threshold voltage of the transistor increases as the temperature decreases.

Figure 5:
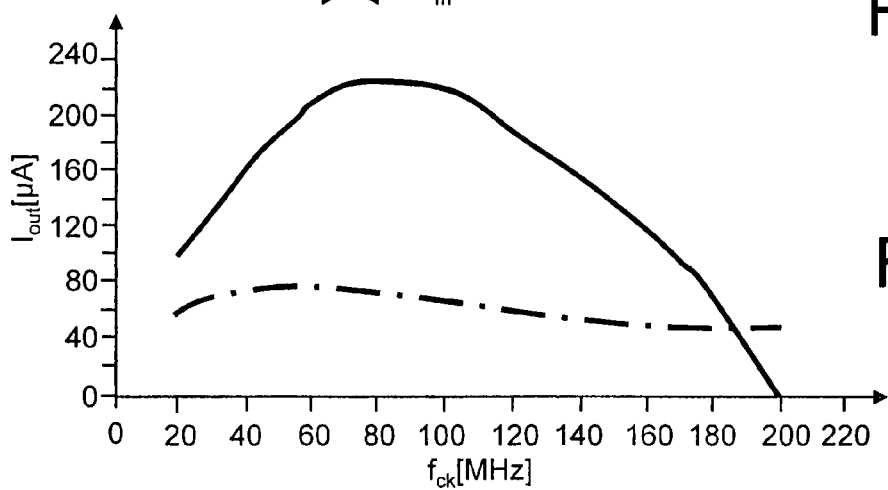
FIG. 5 shows a simulation performed by the present applicant on the circuit of FIG. 1.

This situation is highlighted in FIG. 5, which shows the plots of the current $I_{out}$ as a function of the frequency $f_{ck}$, both in the presence of the second time interval $T_{delay}$ (solid line) and in the absence of said second time interval $T_{delay}$ (dashed line), at the operating temperature of −40° C. In particular, the current $I_{out}$ was measured with a value of $(n/2+1) \cdot V_{DD}$ for the output voltage $V_{out}$ of the charge-pump circuit; i.e., it was measured in an operating area located approximately at the middle of the characteristic $V_{out}/I_{out}$ of the charge-pump circuit.

According to one aspect of the present invention, it is consequently proposed to modify the charge-pump circuit so as to guarantee that the voltage on the gate terminal of the charge-transfer transistor 11i, 11j will assume in any case values such as to enable a sufficient conduction of the charge-transfer transistor 11i, 11j in all kind of operating conditions.

FIG. 6 shows the circuit diagram of a charge-pump device 30 modified as indicated above and comprising a charge-pump circuit 32 and a phase-generator stage 33.

The phase-generator stage 33 comprises a logic circuit, which receives at its input a clock signal CK and generates at its output four phase signals A, B, C, D for the charge-pump circuit 32.

The charge-pump circuit 32 is similar to the charge-pump circuit 1 described with reference to FIG. 1, so that similar parts will not be described again and will be designated by the same reference numbers.

In the charge-pump circuit 32, the phase signals A and C are supplied to a voltage-booster stage 34i, 34j (namely, the phase signal A is supplied at input to the voltage-booster stage 34i, whilst the phase signal C is supplied at input to the voltage-booster stage 34j), and the output of the voltage-booster stage 34i, 34j is connected to the second terminal of the boost capacitor 12i, 12j. In particular, the voltage-booster stage 34i, 34j supplies at its output a boosted voltage with respect to the voltage received at its input (the voltage of the respective phase signal A, C). In this way, the voltage $V_G$ has a value such as to drive into conduction the charge-transfer transistor 11i, 11j during the charge-transfer interval $T_q$, in every possible operating condition (in particular, at low temperatures).

A schematic circuit diagram of the voltage-booster stage 34j is shown in FIG. 7, for just one elementary stage 2, namely, an even elementary stage 2j; the same description applies also to the odd elementary stage 2i and the corresponding voltage-booster stage 34i, and consequently will not be repeated.

In detail, the voltage-booster stage 34j comprises a first inverter 40 having: a first input, which is connected to the input of the voltage-booster stage 34j and receives the phase signal C; a second input connected to a boosted line 41; and an output connected to the output of the voltage-booster stage 34j. In detail, the first inverter 40 comprises a first transistor 44, of a PMOS type, and a second transistor 45, of an NMOS type.

The voltage-booster stage 34j further comprises a second inverter 46, of a logic type, and an accumulation capacitor 47. The second inverter 46 has: a first input, which is connected to the input of the voltage-booster stage 34j and receives the phase signal C; a second input, which is connected to the supply line 5 and receives the supply voltage $V_{DD}$; and an output connected to a first terminal of the accumulation capacitor 47. The accumulation capacitor 47 moreover has a second terminal connected to the boosted line 41.

The voltage-booster stage 34j finally comprises a switching stage 48, in particular of a unidirectional type, which is connected between the boosted line 41 and the supply line 5, and is represented schematically as a diode 49, having its anode connected to the supply line 5 and its cathode connected to the boosted line 41.

Operation of the voltage-booster stage 34j is now described.

When the phase signal C has a high value, the output of the second inverter 46 has a low value, the switching stage 48 is closed (the diode 49 conducts), and the accumulation capacitor 47 charges to the voltage $V_{DD}$. In this situation, the output voltage of the voltage-booster stage 34j has a low value, and the charge-transfer transistor 11j does not conduct, whereas, instead, the pre-charge transistor 13j conducts. The boost capacitor 12j consequently charges to the voltage on the charge-transfer node 18i of the preceding odd elementary stage 2i.

When, instead, the phase signal C has a low value (time interval coinciding with the charge-transfer interval $T_q$ for the elementary stage in question), the output voltage of the second inverter 46 is equal to $V_{DD}$, and the voltage on the second terminal of the accumulation capacitor 47 (coinciding with the voltage on the boosted line 41) assumes the value $2V_{DD}$, in so far as the accumulation capacitor 47 is charged at $V_{DD}$, and the switching stage 48 is in this case in an open condition (the diode 49 does not conduct). The output voltage of the voltage-booster stage 34j is consequently equal to $2V_{DD}$, and the voltage $V_G$ has risen by $2V_{DD}$ with respect to the voltage present on the boost capacitor 12j during the interval in which the phase signal C has a high value. Furthermore, the source terminal of the charge-transfer transistor 11j is, at the start of the charge-transfer interval $T_q$, at the voltage on the charge-transfer node 18i of the preceding odd elementary stage 2i, and so is always less than the voltage of the gate terminal. In this way, turning-on of the charge-transfer transistor 11j and start of the charge transfer is guaranteed.

In particular, due to the presence of the voltage-booster stage 34j, the voltage $V_G$ is increased by $V_{DD}$ as compared to the traditional charge-pump circuit during the charge-transfer interval $T_q$. In fact, the voltage on the second terminal of the boost capacitor 12j is $2V_{DD}$ in the presence of the voltage-booster stage 34j, whereas it is $V_{DD}$ in a circuit of a traditional type.

FIG. 8 shows a circuit embodiment of the switching stage 48.

In detail, the switching stage 48 comprises a third inverter 50 and a switching element 52. The third inverter 50 has a first input connected to the input of the voltage-booster stage 34j and receives the phase signal C, a second input connected to the boosted line 41, and an output connected to the switching element 52. In greater detail, the third inverter 50 is constituted by a third transistor 54, of a PMOS type, and by a fourth transistor 55, of an NMOS type. The switch 52 is a fifth transistor 57 of a PMOS type, which has its gate terminal connected to the output of the third inverter 50, its source terminal connected to the supply line 5, and its drain terminal connected to the second terminal of the accumulation capacitor 47. It should be noted that the fifth transistor 52 conducts when the phase signal C has a high value, whereas it is reversely biased when the phase signal C has a low value, thus operating in a synchronous way with the clock signal CK.

The increase in the voltage $V_G$ guaranteed by the voltage-booster stage 34i, 34j causes an increase in the conduction of the charge-transfer transistor 11i, 11j (provided that the transistor is correctly sized), and consequently an increase in the current $I_{out}$ supplied by the corresponding charge-pump circuit. In particular, the aforesaid increase in the voltage $V_G$ makes it possible to guarantee turning-on and conduction of the charge-transfer transistor 11j even in the absence of the second time interval $T_{delay}$, in so far as in this case the prior increase of the voltage $V_G$ before starting of the charge-transfer interval $T_q$ is no longer necessary.

Consequently, according to a further aspect of the present invention, the phase-generator stage 33 times the phase signals A, B, C and D in such a manner that no delay between switching of the phase signal B and switching of the phase signal D is provided, and thus so as to eliminate the second time interval $T_{delay}$.

Figure 9:
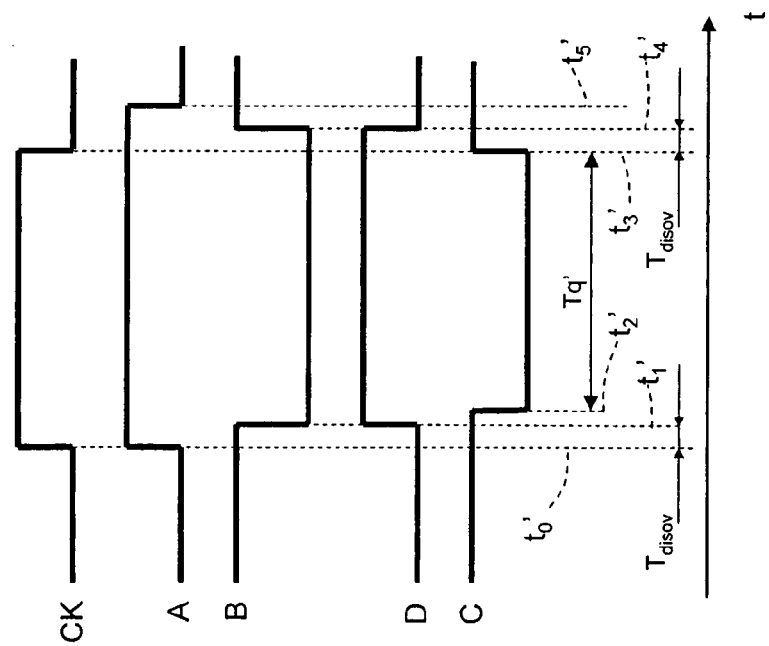
FIG. 9 shows plots of electrical quantities of the device of FIG. 6.

FIG. 9 shows the timing of the phase signals A, B, C, D, which implements what described above. The phase signal A switches from the low value to the high value at the rising edge of the clock signal CK, at an instant $t_0'$. Next, once the first time interval $T_{disov}$ has elapsed, the phase signal B switches from the high value to the low value at an instant $t_1'$. The phase signal D switches from the low value to the high value simultaneously to the switching of the phase signal B (without any delay—second time interval $T_{delay}$ zero). At an instant $t_2'$ (separated from the instant $t_1'$ by a time interval due substantially to the delay of the logic gates), the phase signal C switches from the high value to the low value, and the charge-transfer interval $T_q'$ thus starts. At an instant $t_3'$ the phase signal C switches again to the high value, and then, after the first time interval $T_{disov}$ and at an instant $t_4'$, the phase signals D and B switch simultaneously (once again without any delay); namely, the phase signal D switches to the low value, and the phase signal B switches to the high value. Next, at an instant $t_5'$, the phase signal A switches to the low value, setting the charge-transfer transistor 11i in an open condition.

In this case, the charge-transfer time $T_q'$ is expressed by the relation (assuming a negligible delay due to the logic gates):

$$T_q' = \frac{T_{ck}}{2} - T_{disov}$$

Due to the absence of the second time interval $T_{delay}$, the useful time for the charge transfer is greater, and the frequency $f_{max}$ above which the current $I_{out}$ supplied by the charge-pump circuit decreases (see FIG. 3) shifts to a higher value. Consequently, it is possible to operate at higher frequencies $f_{ck}$ and thus further increase the current $I_{out}$ supplied by the charge-pump circuit 32.

Figure 10:
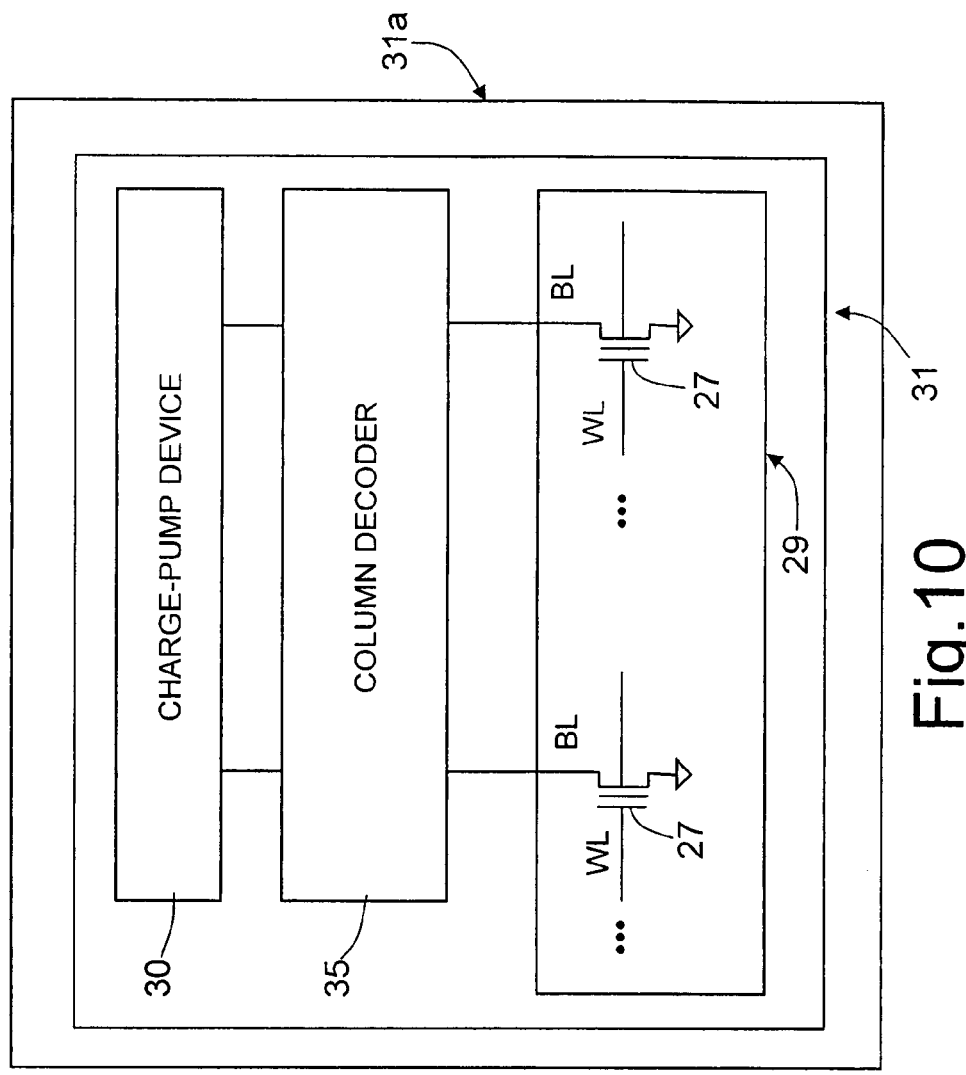
FIG. 10 shows a block diagram of a memory device incorporating the device of FIG. 6.

As shown in FIG. 10, the described charge-pump device 30 can advantageously be used in a memory device 31, in particular of a NOR Flash type, comprising an array 29 of memory cells 27. In a per-se known manner, the memory cells 27 have their gate terminal connected to a respective wordline WL and their drain terminal connected to a respective bitline BL. In the illustrated schematic representation, the charge-pump device 30 is connected to the drain terminals of the memory cells 27, through interposition of a column decoder 35. Furthermore, the load of the charge-pump circuit 32 is in this case substantially constituted by the capacitance of the bitlines BL of the memory array 29. Advantageously, the memory device 31 is incorporated in a portable apparatus 31a, in particular a mobile phone, and is electrically connected to a central processing unit (not shown) of the portable apparatus 31a.

The advantages of the proposed solution are clear when comparing the frequency $f_{max}$ that can be obtained with a charge-pump circuit of a traditional type and the frequency $f_{max}'$ that can be obtained with the charge-pump circuit according to the invention.

For the purposes of this comparison, the current circulating in the charge-transfer transistor 11i, 11j in the absence of load (short-circuit current) and on the hypothesis that the current has an exponential evolution during the charge-transfer interval $T_q$, is considered. On this hypothesis, the current, designated in this case by $I_{cto}$, is given by:

$$I_{cto} = \frac{V_{DD} \cdot C_s \cdot (1 - e^{-t/\tau})}{2 \cdot (T_m + T_q)}$$

where $\tau$ is the exponential time constant, and $C_s$ is the capacitance of the pumping capacitor 10$i$, 10$j$.

Figure 11:
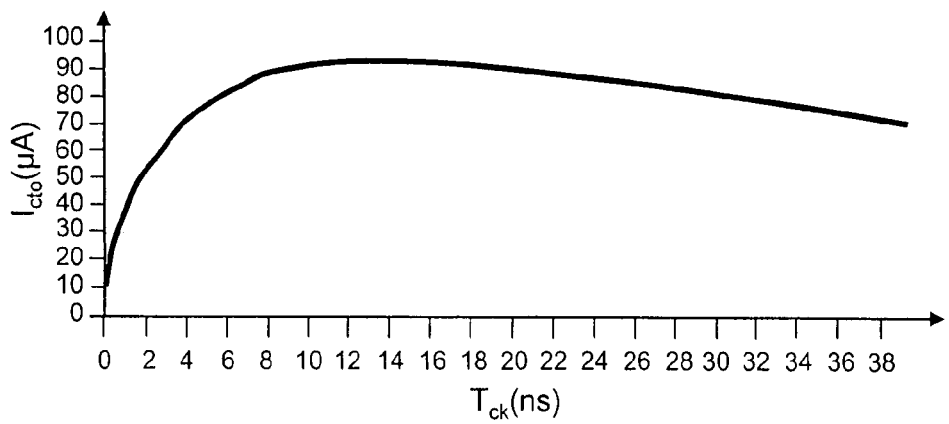
FIGS. 11-14 show plots illustrating the advantages in terms of current output of the device of FIG. 6 as compared to devices of a known type.
Figure 12:
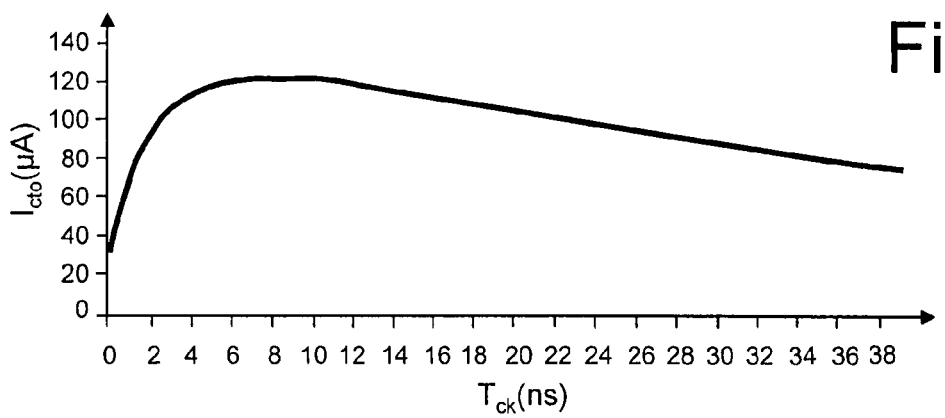

FIG. 11 and FIG. 12 show the plots of the current $I_{cto}$ as a function of the period $T_{ck}$ of the clock signal respectively in the charge-pump circuit 1 of FIG. 1 and in the charge-pump circuit 32 of FIG. 6 (on the hypothesis that the same values of the circuit components are used).

It may be shown that the charge-transfer interval $T_q$ whereby the maximum value of output current is obtained is 3.6 ns in the first case (traditional circuit), whereas, in the second case (circuit according to the invention), said interval is 2.3 ns. Using the relation:

$$f_{ck} = \frac{1}{2 \cdot (T_m + T_q)}$$

and taking into account the presence or absence of the second time interval $T_{delay}$ (assumed equal to 2 ns) and assuming the first time interval $T_{disov}$ equal to 0.5 ns, then a maximum frequency $f_{max}$ of approximately 80 MHz is obtained in the first case, and a maximum frequency $f_{max}'$ of approximately 180 MHz is obtained in the second case.

Figure 13:
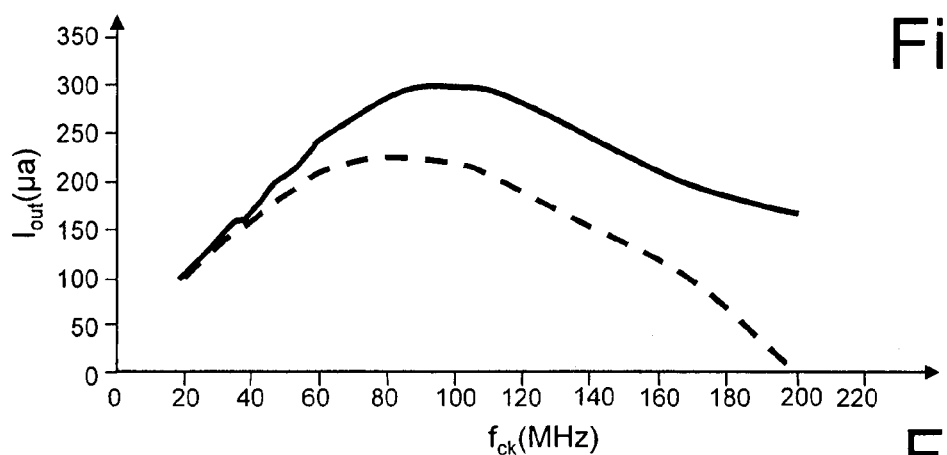

In FIG. 13, the current supplied by the charge-pump circuit 1 of FIG. 1 is represented with a dashed line, and the current supplied by the charge-pump circuit 32 of FIG. 6 with a solid line. As may be noted, the current $I_{out}$ supplied by the charge-pump circuit 32 is always higher, and the difference becomes much more appreciable as the frequency $f_{ck}$ increases. The current $I_{out}$ is calculated in the same conditions as in FIG. 5, that is, imposing an output voltage $V_{out}$ equal to $(n/2+1) \cdot V_{DD}$, i.e., in an operating area positioned approximately at the middle of the voltage/current characteristic of the charge-pump circuit.

Figure 14:
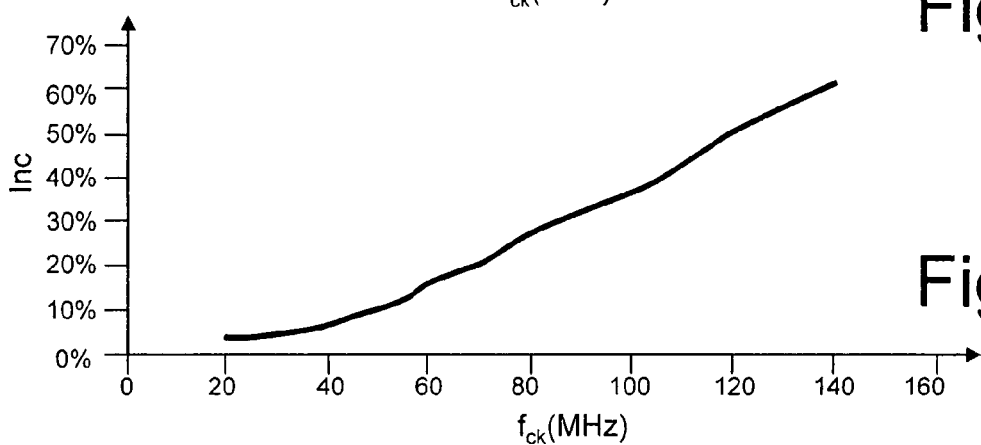

FIG. 14 shows the percentage increase (designated by Inc) of the current supplied by the charge-pump circuit 32 as compared to the current supplied by the charge-pump circuit 1 of a traditional type, as the frequency $f_{ck}$ varies, the plots being obtained with circuit simulations. At the maximum operating frequency of the charge-pump circuit 1 (equal to approximately 60 MHz in the real case where the parasitic capacitances are considered), the current increase associated to the charge-pump circuit 32 of FIG. 6 is approximately 20%. Said current increase increases as the frequency $f_{ck}$ increases, until it reaches more than 40% at an operating frequency of approximately 100 MHz.

Furthermore, said increase in the supplied current is obtained with an increase of the occupied area (dedicated to the voltage-booster stage 34$i$, 34$j$) that is smaller than 10%.

Finally, it is clear that modifications and variations may be made to what is described and illustrated herein, without thereby departing from the scope of the present invention, as defined in the appended claims.

The voltage-booster stage can be made with a different circuit architecture, enabling increase in the voltage on the gate terminal of the charge-transfer transistor during the charge-transfer interval. In particular, the voltage-booster stage could supply at output a boosted voltage even higher than the indicated value of $2V_{DD}$.

In general, the voltage-booster stage can advantageously be used whenever it is necessary to drive a charge-transfer transistor more into conduction.

Furthermore, as highlighted, the described voltage-booster stage can be used even without modifying the timing of the phase signals (and hence without eliminating the second time interval $T_{delay}$). In fact, an increase in the current supplied by the charge-pump circuit is in any case obtained, thanks to the increased conduction of the charge-transfer transistor.

The charge-pump circuit itself could present a different circuit architecture.

Finally, the charge-pump device can be used in electronic devices other than the memory described, for example, in voltage regulators, DC/DC power supplies, etc.; and the described memory device can be incorporated in other portable apparatus, such as digital cameras, Mp3 readers, cellphones, smart cards, PDAs, game consoles, etc.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A charge-pump device comprising a charge-pump circuit having an input connected to a supply line and receiving a supply voltage, and an output; said charge-pump circuit having at least one first elementary stage defining a first transfer node and a second transfer node that can be connected respectively to said input and to said output, and having at least a first phase input; said first elementary stage further comprising: a first switching element, arranged between said first transfer node and said second transfer node and having a control terminal receiving a control signal, said first switching element being closed during a charge-transfer interval; and first charge-storage means connected between said control terminal and said first phase input; wherein said first elementary stage further comprises a voltage-booster stage having an input connected to said first phase input of said first elementary stage, and an output, which is connected to said first charge-storage means and supplies a boosted phase signal; said voltage-booster stage being configured to be operative during said charge-transfer interval;

wherein said voltage-booster stage comprises: a first inverter, having a first input connected to said first phase input and receiving a first phase signal, a second input connected to a boosted line, and an output connected to said first charge-storage means; and voltage-modifying means configured to vary the voltage of said boosted line;

wherein said voltage-modifying means comprise: a first logic inverter having a first input receiving said phase signal, a second input receiving said supply voltage, and an output; third charge-storage means having a first terminal connected to the output of said first logic inverter, and a second terminal connected to said boosted line; and a unidirectional switching stage connected between said supply line and said boosted line; and wherein said unidirectional switching stage comprises: a second inverter having a first input receiving said first phase signal, a second input connected to said boosted line, and an output; and a third switching element having a first terminal connected to said supply line, a second terminal connected to said boosted line, and a control terminal connected to the output of said second inverter.

2. The device according to claim 1, wherein said first switching element is a MOS transistor having a first conduction terminal connected to said first transfer node, a second conduction terminal connected to said second transfer node, and a gate terminal defining said control terminal.

3. The device according to claim 1, wherein said first phase input receives a first phase signal, and wherein said first elementary stage has a second phase input receiving a second phase signal and further comprises: second charge-storage means connected between said second transfer node and said second phase input; and a second switching element having a first terminal connected to said first transfer node, a second terminal connected to said control terminal of said first switching element, and a control terminal connected to said second transfer node.

4. The device according to claim 1, further comprising a phase-generator stage having an input receiving a clock signal and a plurality of outputs supplying a plurality of phase signals; said phase signals being temporally offset with respect to said clock signal, and switching repeatedly between a first level and a second level; and wherein said charge-pump circuit comprises at least one second elementary stage, which is cascaded to said first elementary stage and has a first phase input; said first and second elementary stages having an own second phase input; said first and second elementary stages receiving a respective first phase signal on a respective first phase input, and a respective second phase signal on a respective second phase input.

5. The device according to claim 4, wherein the second phase signals received by said first and second elementary stages have simultaneous switching with respect to said clock signal.

6. The device according to claim 4, wherein each second phase signal switches after a given delay with respect to the respective first phase signal.

7. The device according to claim 1, wherein said first phase signal switches between a first level and a second level, and wherein said voltage-modifying means are controlled by said phase signal.

8. The device according to claim 7, wherein said voltage-modifying means generate at output a voltage equal to at least twice said supply voltage when said first phase signal assumes said first level, and generate at output a voltage equal to said supply voltage when said phase signal assumes said second level.

9. An apparatus comprising:
an array of memory cells; and
a charge-pump device having an output connected to a current-conduction terminal of said memory cells, wherein said charge-pump device includes an input connected to a supply line and receiving a supply voltage, and an output; said charge-pump circuit having at least one first elementary stage defining a first transfer node and a second transfer node that can be connected respectively to said input and to said output, and having at least a first phase input; said first elementary stage further comprising: a first switching element, arranged between said first transfer node and said second transfer node and having a control terminal receiving a control signal, said first switching element being closed during a charge-transfer interval; and first charge-storage means connected between said control terminal and said first phase input; wherein said first elementary stage further comprises a voltage-booster stage having an input connected to said first phase input of said first elementary stage, and an output, which is connected to said first charge-storage means and supplies a boosted phase signal; said voltage-booster stage being configured to be operative during said charge-transfer interval;

wherein said voltage-booster stage comprises: a first inverter, having a first input connected to said first phase input and receiving a first phase signal, a second input connected to a boosted line, and an output connected to said first charge-storage means; and voltage-modifying means configured to vary the voltage of said boosted line;

wherein said voltage-modifying means comprise: a first logic inverter having a first input receiving said phase signal, a second input receiving said supply voltage, and an output; third charge-storage means having a first terminal connected to the output of said first logic inverter, and a second terminal connected to said boosted line; and a unidirectional switching stage connected between said supply line and said boosted line; and wherein said unidirectional switching stage comprises: a second inverter having a first input receiving said first phase signal, a second input connected to said boosted line, and an output; and a third switching element having a first terminal connected to said supply line, a second terminal connected to said boosted line, and a control terminal connected to the output of said second inverter.

10. The apparatus according to claim 9; wherein the apparatus is an electronic device selected from the group consisting of a voltage regulator, a DC/DC power supply, a digital camera, an MP3 reader, a mobile telephone, a smart card, a PDA, and a game console.

11. The apparatus according to claim 9, wherein the apparatus is a memory device.

12. The apparatus according to claim 11, wherein the memory device is a NOR Flash type memory.

13. The apparatus according to claim 9, further comprising a column decoder connected between the charge-pump device and the current-conduction terminal of the memory cells.

14. A method of operation of a charge-pump device, comprising:
supplying a first phase signal to a first charge-storage means of a first elementary stage and a second phase signal to a second charge-storage means of a second elementary stage, said first phase signal and said second phase signal switching between a first level and a second level such as to cause switching of a first switching element of said first elementary stage and a second switching element of said second elementary stage between a conduction state and an inhibition state;
boosting said first phase signal up to a boosted value higher than a supply voltage when said first switching element is in said conduction state;
boosting said second phase signal up to a second boosted value higher than said supply voltage when said second switching element is in said conduction state; and
supplying a third phase signal to a first charge-pump means and a fourth phase signal to a second charge-pump means, said third phase signal and said fourth phase signal switching out of phase and approximately between the first level and the second level.

15. The method according to claim 14, wherein said first boosted value is and said second boosted value are equal to at least twice said supply voltage.

16. The method according to claim 14, wherein said third phase signal and said fourth phase signal switch with a given delay with respect to said first phase signal.

17. The method according to claim 16, wherein said second phase signal switches with another given delay with respect to said third phase signal and said fourth phase signal.

18. An apparatus comprising:
- a charge-pump circuit including an input and an output, the input being connected to a supply voltage line;
- at least one first elementary stage configured to connect to the input and to the output of the charge-pump circuit, and configured to receive a first phase signal; and
- a voltage-booster stage including:
  - a first inverter configured to receive the first phase signal and including an input connected to a boosted line; and
  - voltage-modifying means configured to vary the voltage of the boosted line, and including a switching stage connected between the supply voltage and the boosted line, the switching stage including:
    - a second inverter having a first input configured to receive the first phase signal, a second input connected to the boosted line, and an output; and
    - a switching element having a first terminal connected to the supply line, a second terminal connected to the boosted line, and a control terminal connected to the output of the second inverter.

19. The apparatus according to claim 18 wherein the at least one first elementary stage includes a first input terminal, a first output terminal, a first control terminal, and first charge-pump means connected to the first output terminal, and wherein the apparatus further comprises at least one second elementary stage cascaded to the first elementary stage and including a second input terminal, a second output terminal, a second control terminal, and second charge-pump means connected to the second output terminal.

20. The apparatus according to claim 18, wherein the switching element is a transistor.

21. The apparatus according to claim 18, wherein the second inverter comprises a PMOS transistor and an NMOS transistor, the PMOS transistor and the NMOS transistors each having a gate terminal configured to connect to the first phase signal.

22. The apparatus according to claim 18, wherein the apparatus is a memory device.

23. The apparatus according to claim 18, further comprising a phase-generator stage having an input configured to receive a clock signal and a plurality of outputs configured to supply a plurality of phase signals including a first phase signal to a first charge-storage means and a second phase signal to a second charge-storage means, the first phase signal and the second phase signal switching between a first level and a second level.

24. The apparatus according to claim 23, wherein the phase-generator stage is further configured to supply a third phase signal to the first charge-pump means and a fourth phase signal to the second charge-pump means, the third phase signal and said fourth phase signal switching out of phase and approximately simultaneously between the first level and the second level.

* * * * *